United States Patent [19]
Lee

[11] Patent Number: 5,315,188
[45] Date of Patent: May 24, 1994

[54] HIGH VOLTAGE SWITCHING CIRCUIT

[75] Inventor: Woung-Moo Lee, Seoul, Rep. of Korea

[73] Assignee: Samsung Electronics Co., Ltd., Kyungku, Rep. of Korea

[21] Appl. No.: 970,936

[22] Filed: Nov. 2, 1992

[51] Int. Cl.$^5$ .................... H03K 3/01; H03K 17/687
[52] U.S. Cl. .................... 307/574; 307/575; 307/296.2; 307/264; 307/578
[58] Field of Search .................... 307/574–575, 307/296.2, 264, 577–578, 584, 475

[56] References Cited
U.S. PATENT DOCUMENTS
5,039,882  8/1991  Arakawa .................... 307/296.2

Primary Examiner—Margaret Rose Wambach
Attorney, Agent, or Firm—Hecker & Harriman

[57] ABSTRACT

A high voltage switching circuit includes a buffer circuit for buffering an input signal, a high voltage pumping circuit for producing a desired voltage in response to an output signal of the buffer circuit, and a disconnecting circuit for disconnecting the buffer circuit and high voltage pumping circuit when the output voltage of the buffer circuit is the source voltage and that of the high voltage pumping circuit is a high voltage, wherein the disconnecting circuit includes an enhancement transistor and depletion transistor connected in series, gates of the transistors being commonly connected to the source voltage.

6 Claims, 3 Drawing Sheets

HIGH VOLTAGE SWITCHING CIRCUIT

BACKGROUND OF THE INVENTION

1. Field of The Invention

The present invention relates to semiconductor memory devices, and more particularly to a high voltage switching circuit.

2. Background Art

For an EEPROM (Electrically Erasable Programmable Read Only Memory), a destructive voltage across a transistor is a serious problem caused by a high voltage produced in a memory integrated circuit when programming or erasing data.

A conventional high voltage switching circuit shown in FIG. 1 includes: a NAND gate 10 for buffering input signals; a depletion type transistor 12 having a channel connected between an output terminal of NAND gate 10 and a first node 11 for disconnecting a source voltage from a high voltage; and, a high voltage pumping circuit 14 connected between the first node 11 and an output terminal for producing either a high voltage or a ground voltage in response to the input signals. The high voltage pumping circuit 14 further includes: a first NMOS transistor 16 having a channel connected between a high voltage supply $V_{pp}$ and a second node 22, and further having a gate connected to the first node 11; a second NMOS transistor 18 having a channel connected between the first and second nodes 11 and 22, and further having a gate connected to the second node 22, and a third NMOS transistor 30 having a gate connected to the second node 22 and a channel having both terminals commonly connected to each other.

In a high voltage switching operation, the input terminal is supplied with a high voltage $V_{pp}$, a first input ΦD of NAND gate 10 is maintained in a high state, a gate input ΦP of depletion transistor 12 is in a low state, and an input Φ of the third NMOS transistor 30 makes periodic oscillations. In this case, if a second input of NAND gate 10 receives a signal having a high level, the output of NAND gate 10 is in a ground level and, therefore, so is first node 11.

However, if the second input of NAND gate 10 receives a signal having a low level, the output of NAND gate 10 is a high level. Depletion transistor 12 is turned on to provide the first node 11 with a voltage obtained by subtracting the threshold voltage of transistor 12 from the high level of NAND gate 10, thereby driving the high voltage pumping circuit 14. Also, depletion transistor 12 disconnects the output voltage of NAND gate 10 from the high voltage of first node 11. In this case, the gate of transistor 12 is provided with a ground voltage. If the gate of depletion transistor 12 is provided with a source voltage $V_{cc}$, a short circuit operation occurs between high voltage supply $V_{pp}$ and source voltage $V_{cc}$, so as not to produce a high voltage on the output terminal.

In a high voltage switching operation, a break-down voltage across depletion transistor 12 occurs due to an electric field between the gate and drain of depletion transistor 12 when the output terminal is raised to a high voltage and the gate of depletion transistor 12 is grounded. Hence, a high voltage at the output terminal may not be produced above a given value in order to prevent this problem. The problem can be resolved through the manufacturing process, however, the size of the semiconductor integrated circuit is unavoidably increased making it difficult to achieve a highly integrated circuit.

SUMMARY OF THE PRESENT INVENTION

It is an object of the present invention to provide a high voltage switching circuit for a semiconductor memory device that produces a desired high voltage.

According to an aspect of the present invention, a high voltage switching circuit for a semiconductor memory device includes a depletion type transistor and enhancement type transistors connected in series. Their gates are connected to a source voltage, whereby the intensity of the electric field across the gate and drain of the transistors is reduced, thereby raising the breakdown voltage.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PRESENT INVENTION

Figure 1:
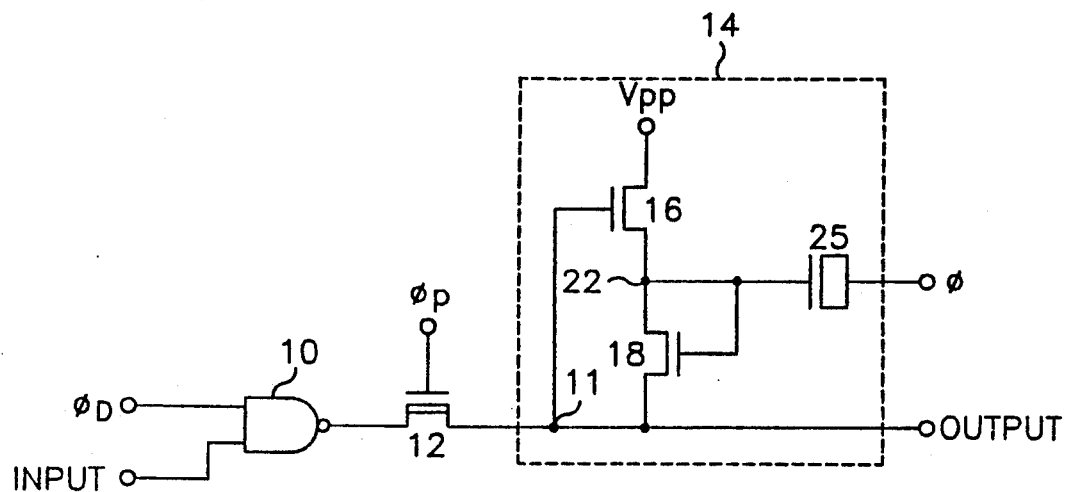
FIG. 1 is a schematic diagram of a conventional circuit.
Figure 2:
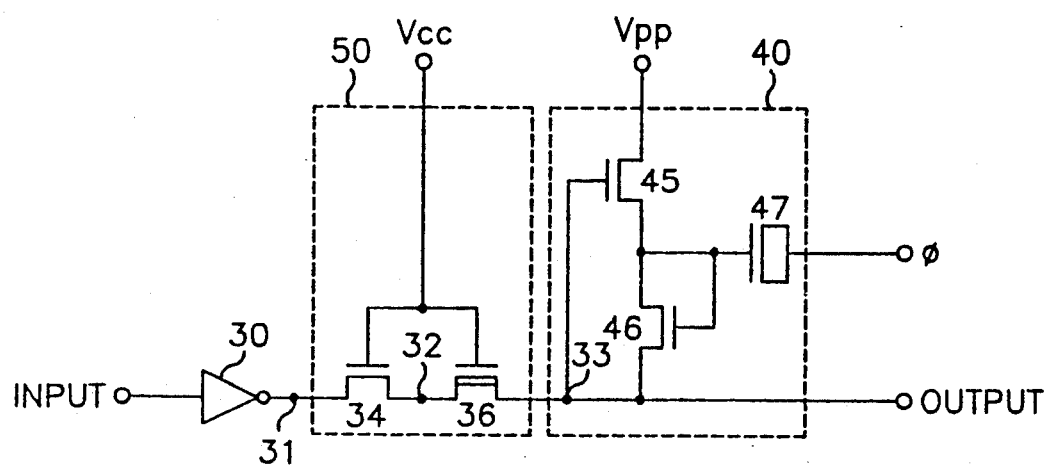
FIG. 2 is a schematic diagram of a circuit according to an embodiment of the present invention.

A high voltage switching circuit is shown in FIG. 2 including an inverting circuit 30 for buffering an input control signal, a high voltage pumping circuit 40 for producing a high or ground voltage in response to output signals from inverting circuit 30 and a disconnecting circuit 50 for electrically disconnecting the inverting circuit 30 from high voltage pumping circuit 40. In this case, inverting circuit 30 may be substituted by a NAND gate or NOR gate. Disconnecting circuit 50 includes a depletion type transistor 36 and an enhancement type transistor 34.

In high voltage switching operation, an input terminal is provided with a high voltage $V_{pp}$, and input Φ makes periodic oscillations. If the control input of inverting circuit 30 is high, first, second and third nodes 31, 32 and 33 become low, so that high voltage pumping circuit 40 is not driven. However, if the control input of inverting circuit 30 is low, the first node 31 becomes high, and the second node 32 is dropped from a source voltage $V_{cc}$ to a voltage $V_{cc}-V_{TE}$ that is obtained by subtracting a threshold voltage $V_{TE}$ of enhancement transistor 34 from source voltage $V_{cc}$. The voltage $V_{cc}-V_{TE}$ drives high voltage pumping circuit 40 to raise the voltage level of output terminal, i.e., third node 33 is raised to high voltage $V_{pp}$. The third node 33 and voltage source node 31 are electrically disconnected by enhancement mode transistor 34.

Figure 3:
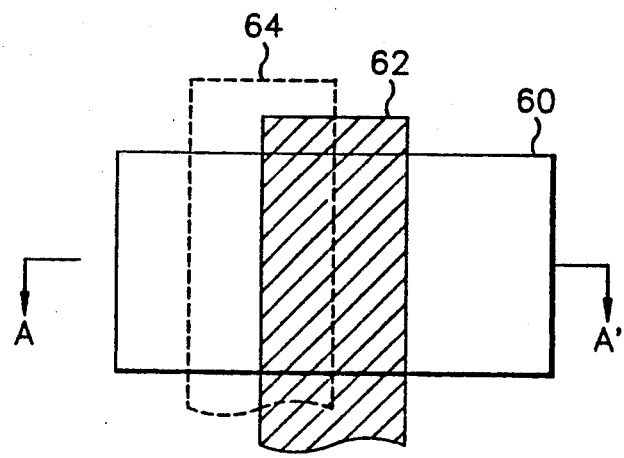
FIG. 3 is a layout for producing the inventive circuit.

Referring to FIG. 3, a device region 60, a polysilicon layer 62 for a gate extending in a given direction over device region 60, and a depletion ion implantation region 64 overlapping a portion of polysilicon layer 62 in device region 60 are formed in a semiconductor substrate.

Figure 4:
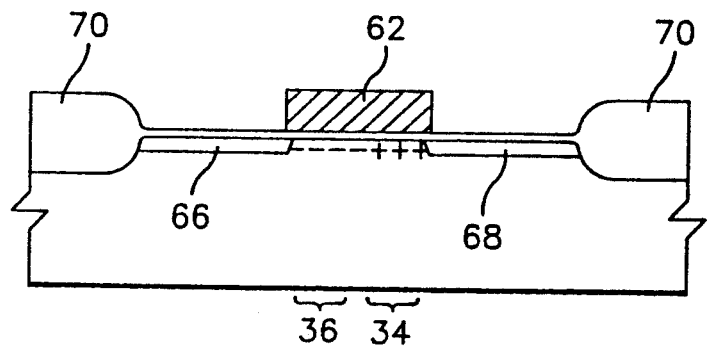
FIG. 4 is a cross sectional view taken along line A-A' of FIG. 3.

Device region 60 shown in FIG. 4 is limited by a field oxide layer 70, and includes a source 66 and a drain 68 separated from each other by a channel region, and gate 62 of polysilicon formed over the channel region. Depletion mode transistor 36 and enhancement mode transistor 34 are formed in the channel region.

Figure 5:
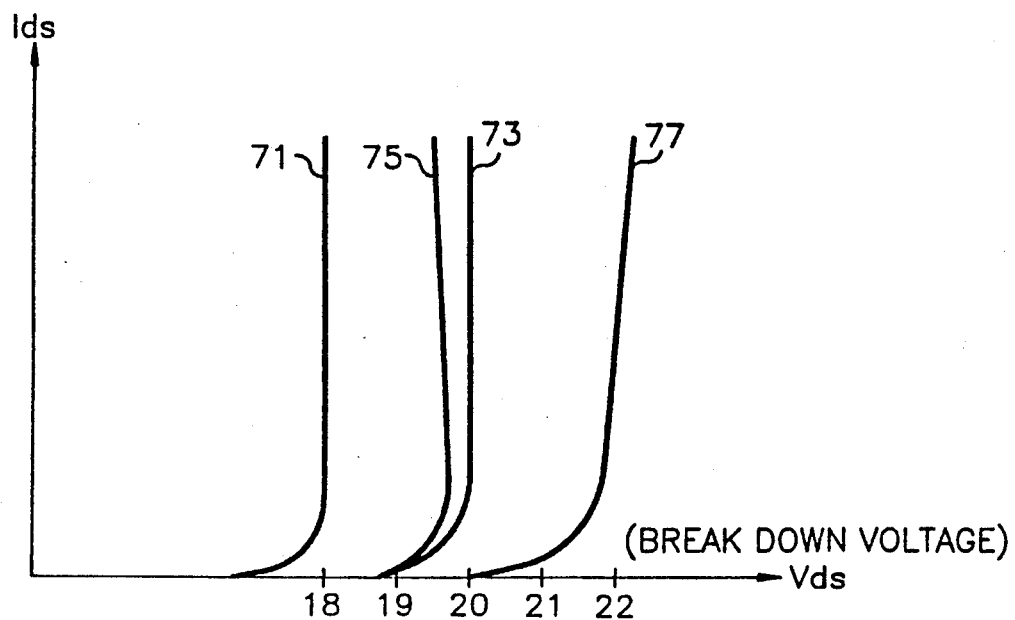
FIG. 5 is a graph comparing breakdown voltages characteristic of enhancement and depletion transistors according to the inventive circuit with that of conventional circuits.
Figure 6:
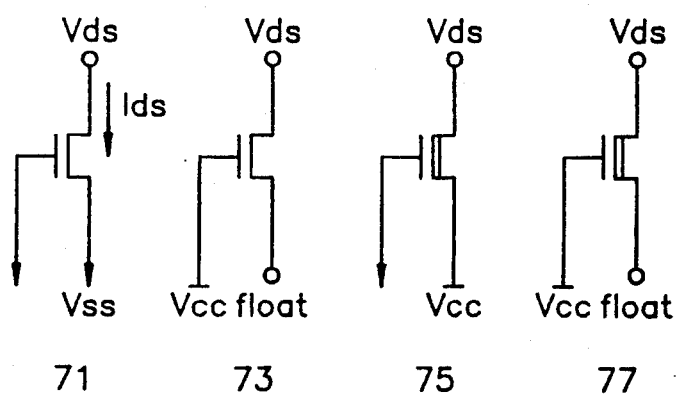
FIG. 6 is a diagram illustrating transistors that correspond to lines 71, 73, 75, and 77 of the breakdown characteristics shown in FIG. 5.

With reference to FIG. 5 (see FIG. 6 also), the breakdown voltage characteristics of enhancement and depletion transistors according to the present invention are compared with those of conventional circuits. Vertical and horizontal axes represent the current and voltage respectively between a drain and source. A line indicated by reference numeral 71 represents a characteristic curve of enhancement NMOS transistor 34 having the gate and source connected to a ground voltage. A line indicated by reference numeral 73 represents a characteristic curve of a floating-source enhancement NMOS transistor having a gate connected to the source voltage according to prior art. The line indicated by reference numeral 75 represents a characteristic curve of a depletion NMOS transistor having a gate connected to a ground voltage and a source to the source voltage according to prior art. The line indicated by reference numeral 77 represents a characteristic curve of a floating-source depletion transistor having a gate connected to the source voltage according to the present invention. Thus, it is clearly apparent that the highest transistor breakdown voltage is obtained by the present invention.

As stated above, the switching circuit of the present invention employs a disconnecting circuit for disconnecting the high voltage of the output terminal and the output voltage of the buffer circuit. The switching circuit includes enhancement and depletion transistors having channels connected in series and gates commonly provided with the source voltage, thus, electric fields applied to the gate and drain of the transistors are lessened when the output voltage is raised to a high level. As a result, the break-down voltage of a transistor is increased so as to produce the desired high voltage at the output terminal of the circuit.

Furthermore, since enhancement and depletion transistors are simultaneously formed in one channel, the layout area of the integrated circuit is reduced achieving a semiconductor memory device having high density. Consequently, a high voltage switching circuit having a maximum high voltage in a minimum size integrated circuit is obtained.

While the invention has been shown and described in detail with reference to a preferred embodiment, it will be apparent to those skilled in the art that modifications in detail may be made without departing from the spirit and scope of the invention.

I claim:

1. A high voltage switching circuit comprising:
   a buffer means for buffering an input signal;
   a high voltage pumping means for producing a given voltage in response to an output signal of said buffer means; and
   a disconnecting means connected between said buffer means and said high voltage pumping means, for disconnecting said buffer means and high voltage pumping circuit when said output signal of said buffer means is a source voltage and said given voltage of said high voltage pumping circuit is a high voltage, said disconnecting means comprising an enhancement transistor and depletion transistor connected in series, gates of said enhancement transistor and said depletion transistor being commonly connected to said source voltage.

2. The high voltage switching circuit of claim 1, wherein said buffer means is an inverter, NAND gate or NOR gate.

3. The high voltage switching circuit of claim 1, wherein said enhancement and depletion transistors comprise adjacent channels formed below a common gate.

4. A high voltage switching circuit comprising:
   a buffer means for buffering an input signal;
   a high voltage pumping circuit for producing a desired voltage in response to an output signal of said buffer means; and
   a disconnecting transistor connected between said buffer means and said high voltage pumping circuit for disconnecting said buffer means and said high voltage pumping circuit when said output signal of said buffer means is a source voltage and said desired voltage of said high voltage pumping circuit is a high voltage, wherein a first channel region adjacent to a source of said disconnecting transistor has a different conductive type from a channel region adjacent to a drain of said disconnecting transistor.

5. The high voltage switching circuit of claim 4, wherein said disconnecting transistor comprises a depletion transistor and an enhancement transistor, a channel of said depletion transistor being said first channel region, a channel of said enhancement transistor being said second channel region.

6. The high voltage switching circuit of claim 5, wherein a gate of said disconnecting transistor is connected with said source voltage.

* * * * *